(12) United States Patent
Whitmer

(10) Patent No.: US 7,827,012 B2
(45) Date of Patent: Nov. 2, 2010

(54) SYSTEM AND METHOD FOR CONTROLLING STRUCTURAL TYPE INTEGRATION

(75) Inventor: Brett D. Whitmer, Kenmore, WA (US)

(73) Assignee: The Boeing Company, Chicago, IL (US)

( * ) Notice: Subject to any disclaimer, the term of this patent is extended or adjusted under 35 U.S.C. 154(b) by 837 days.

(21) Appl. No.: 11/608,402

(22) Filed: Dec. 8, 2006

(65) Prior Publication Data

US 2008/0140242 A1 Jun. 12, 2008

(51) Int. Cl.
G06F 17/50 (2006.01)
(52) U.S. Cl. .............................................. 703/1; 700/98
(58) Field of Classification Search ..................... 703/1, 703/6, 7; 700/98, 97; 345/419; 493/1; 707/9, 707/104.1; 715/219; 422/100; 340/943
See application file for complete search history.

(56) References Cited

U.S. PATENT DOCUMENTS

| | | | | |
|---|---|---|---|---|
| 5,037,363 | A * | 8/1991 | Cocciadiferro et al. | 493/1 |
| 6,499,040 | B1 * | 12/2002 | Vu et al. | 715/209 |
| 7,085,776 | B2 * | 8/2006 | Callahan | 707/104.1 |
| 2001/0047251 | A1 * | 11/2001 | Kemp | 703/1 |
| 2002/0107673 | A1 * | 8/2002 | Haller et al. | 703/1 |
| 2003/0033041 | A1 * | 2/2003 | Richey | 700/98 |
| 2003/0163214 | A1 * | 8/2003 | Ouchi | 700/97 |
| 2004/0153295 | A1 * | 8/2004 | Lohmann et al. | 703/1 |
| 2005/0203718 | A1 * | 9/2005 | Carek et al. | 703/1 |
| 2005/0212797 | A1 * | 9/2005 | Lee et al. | 345/419 |
| 2006/0089737 | A1 * | 4/2006 | Forrester et al. | 700/97 |
| 2006/0106476 | A1 * | 5/2006 | Tornquist et al. | 700/98 |
| 2006/0117012 | A1 * | 6/2006 | Rizzolo et al. | 707/9 |
| 2006/0129259 | A1 * | 6/2006 | Tornquist et al. | 700/98 |
| 2007/0040702 | A1 * | 2/2007 | Mosher et al. | 340/943 |
| 2007/0122314 | A1 * | 5/2007 | Strand et al. | 422/100 |

* cited by examiner

*Primary Examiner*—Paul L Rodriguez
*Assistant Examiner*—Kandasamy Thangavelu
(74) *Attorney, Agent, or Firm*—Weiss & Moy, P.C.

(57) ABSTRACT

A system and methodology for controlling structural type integration to major fittings requires creating a geometrical set of objects identified here as basic starting geometry which consist of external references and relationships to a main component structure. Structural interface detail characteristics and hardware components are identified that make up a major fitting integration connection between the main component structure and a second component structure. Parametric sets and associated geometrical sets containing sketches and geometry objects are identified and created, the parametric sets and associated geometrical sets being associated to a particular hardware component used in the integration connection between the main component structure and the second component structure and used to defined and control the integration connection between the main component structure and the second component structure with respect to fit, form and function. The parameters and geometry objects are published for review by all companies involved in the integration.

18 Claims, 12 Drawing Sheets

SYSTEM AND METHOD FOR CONTROLLING STRUCTURAL TYPE INTEGRATION

BACKGROUND OF THE INVENTION

1. Field of the Invention

This invention relates generally to the integration of component parts during the manufacturing process and, more specifically, to a system and method for controlling structural type integration to major fittings using three-dimensional Computer Aided Design (CAD) tools.

2. Background of the Invention

Large structures such as aircraft are complex structures having a multitude of different parts. Ensuring that all of the component parts match and fit together is a complex process. In the past, a single company may have designed and built the component parts as well as assemble all of the component parts together. In a global economy, the above practice is no longer economically feasible. Thus, a problem arises as to how a company can integrate a large structure, like an aircraft, to ensure that when all the component parts are brought together, all the end item work packages built by different companies and people of different languages from around the globe will fit, form and function as intended.

Presently, most all design work for large structures is done using CAD programs. Unfortunately, current CAD programs do not have the capability to harness the power of relational design and manage change propagation in an effective and efficient manner. Current CAD programs further do not have engineering and manufacturing knowledge imbedded within the program to be reused.

Therefore, a need exists for a system and method to overcome the problems associated with the prior art. The system and method must allow for structural type integration typical to major fitting endeavors and comply with solving the business and technical problems of the prior art.

SUMMARY OF THE INVENTION

In accordance with one embodiment, a computer system comprising a processor for executing program instructions and a memory coupled to the processor for storing the program instructions is disclosed. The programming instructions comprising: determine number of Interface Control Models (ICM) required to accomplish integration of a main component and a second component; create ICM document for integration of the main component and the second component; identify structural interface hardware components to accomplish integration of the main component and the second component; create a parametric set for each hardware component; create a geometric set for each hardware component; create sketches and geometry objects for each parametric set and associated geometrical set; and publishing parameters and geometry objects for review by all companies involved in the integration.

In accordance with another embodiment, a method for controlling structural type integration to major fittings is disclosed. The method requires creating a geometrical set of objects identified as basic starting geometry which consist of external references and relationships to a main component structure. Structural interface detail characteristics and hardware components are identified that make up a major fitting integration connection between the main component structure and a second component structure. Parametric sets and associated geometrical sets containing sketches and geometry objects are identified and created, the parametric sets and associated geometrical sets being associated to a particular hardware component used in the integration connection between the main component structure and the second component structure and used to define and control the integration connection between the main component structure and the second component structure with respect to fit, form and function. The parameters and geometry objects are published for review by all companies involved in the integration.

The features, functions, and advantages can be achieved independently in various embodiments of the present invention or may be combined in yet other embodiments.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
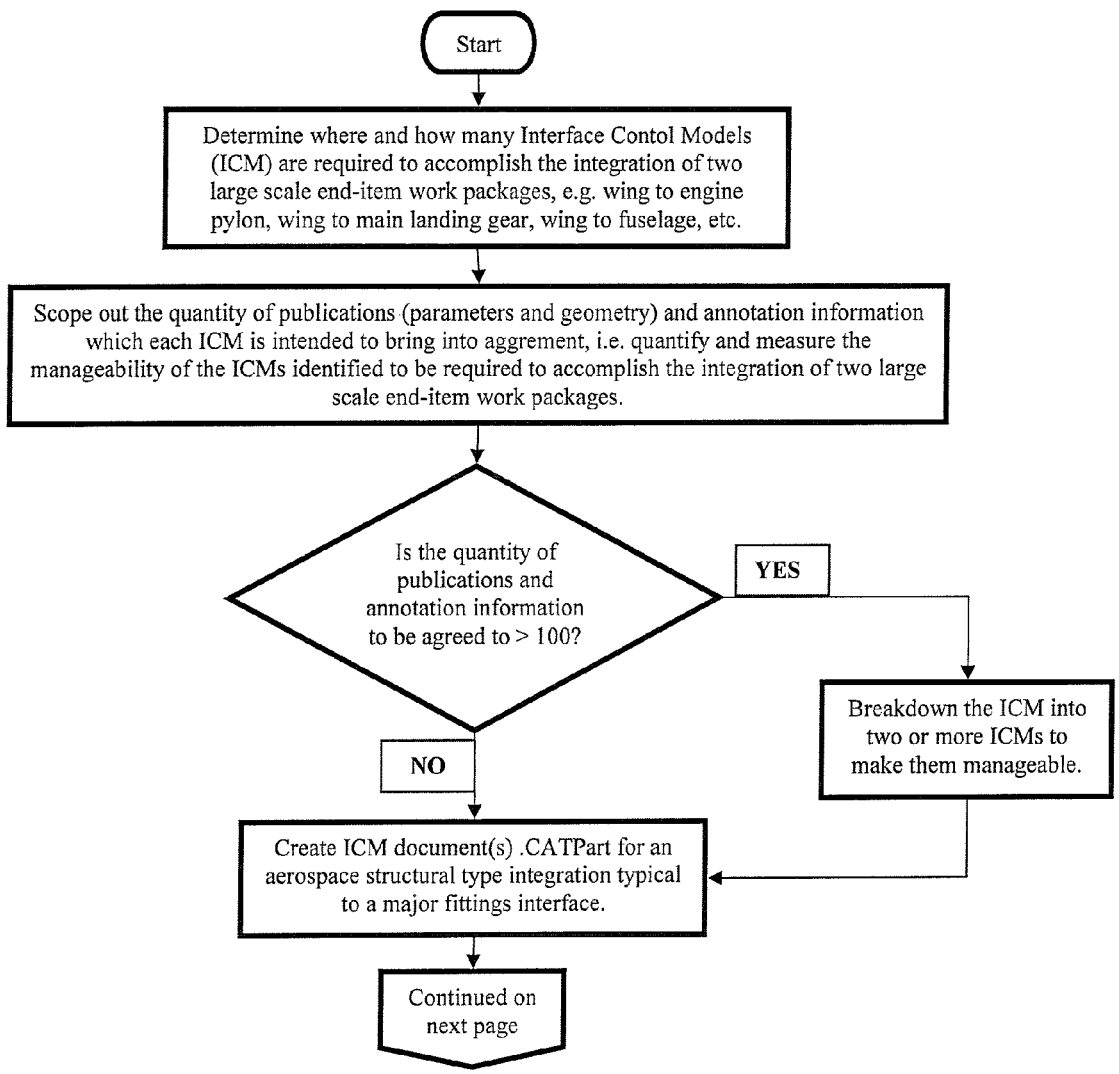
FIG. 1 is flowchart depicting the software algorithm for controlling structural type integration to major fittings.
Figure 2:
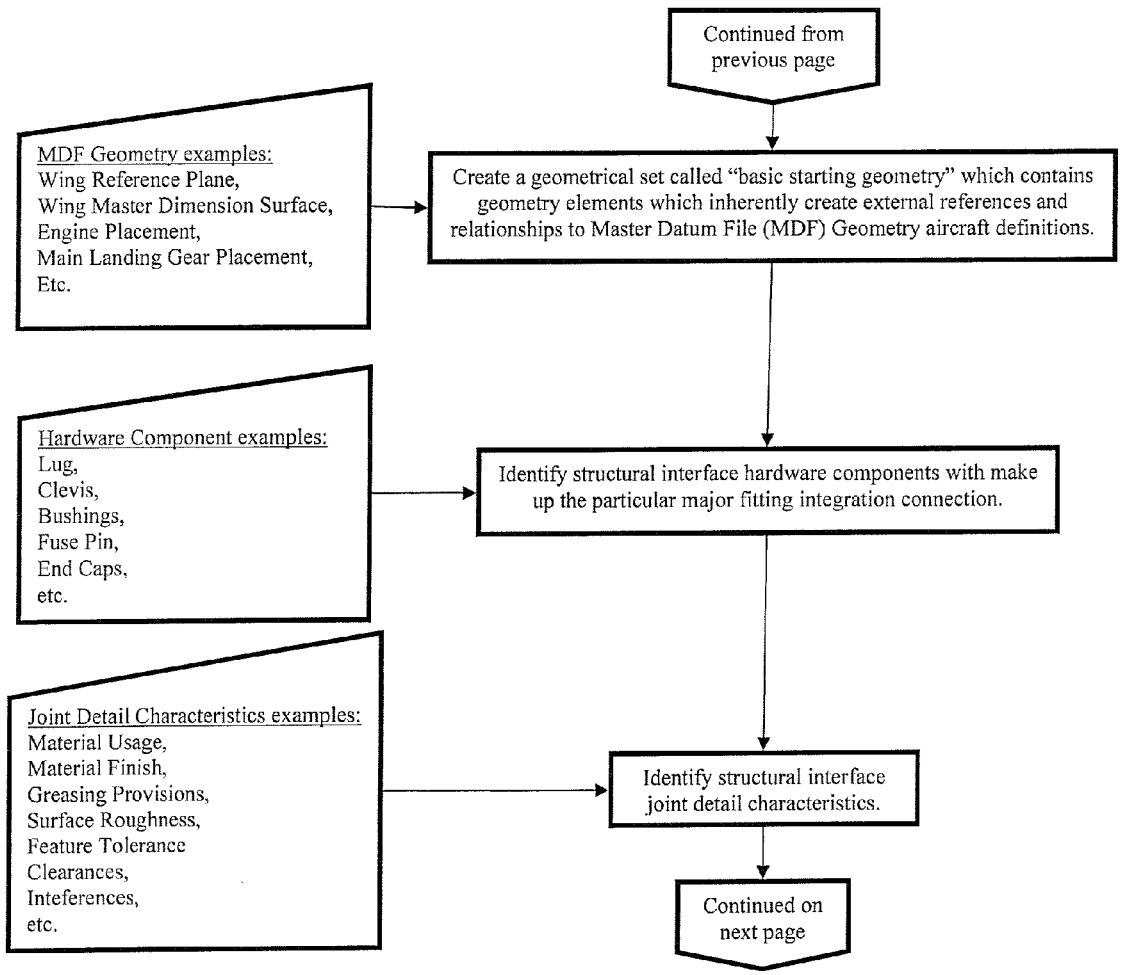
FIG. 2 is flowchart further depicting the software algorithm for controlling structural type integration to major fittings.
Figure 3:
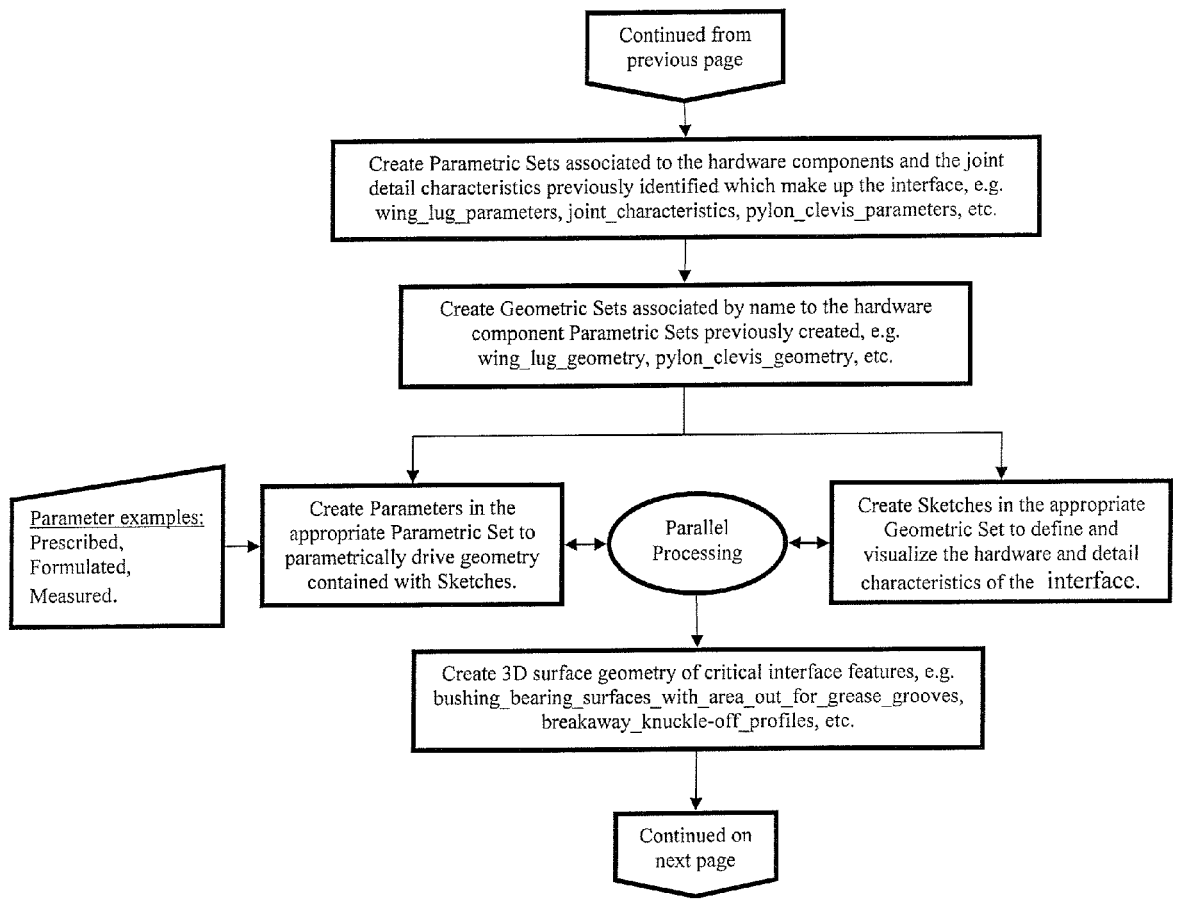
FIG. 3 is flowchart further depicting the software algorithm for controlling structural type integration to major fittings.
Figure 4:
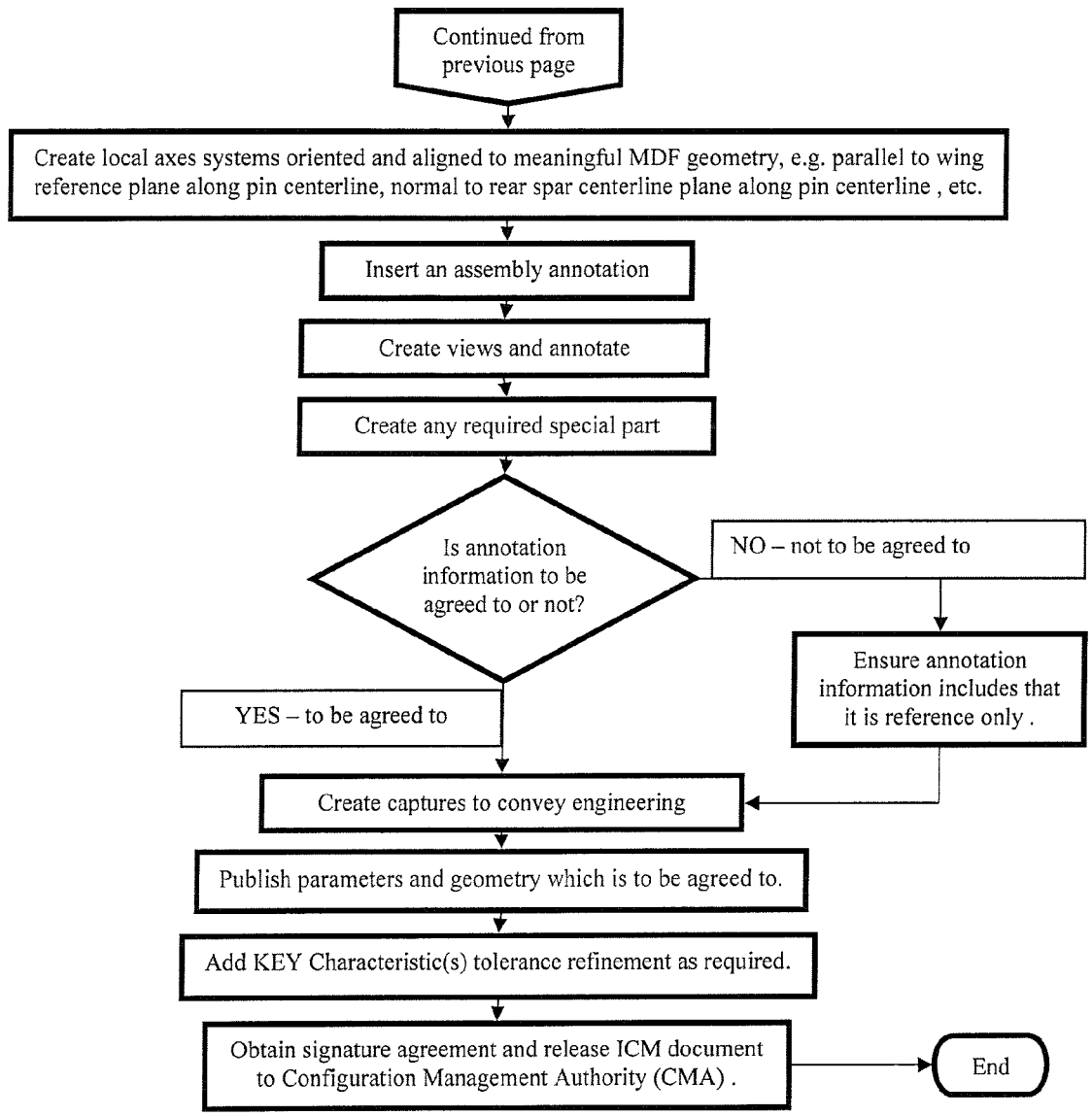
FIG. 4 is flowchart further depicting the software algorithm for controlling structural type integration to major fittings.

In accordance with one embodiment, a software algorithm/methodology (hereinafter methodology) to allow for structural type integration typical to major fitting endeavors is disclosed. The methodology will allow for the integration of component parts to form large structures, such as aircraft, to ensure that when all component parts are brought together, all the end item work packages built by different companies and people of different languages from around the globe will fit, form, and function as intended.

The present methodology will allow for the forming of high quality and powerful Interface Control Model (ICM) documents. The methodology will make engineering and manufacturing knowledge part of the ICM document product definition. The methodology inherently provides high quality ICM document publications to use downstream in the creation of higher level Interface Annotation Requirements Model (IARM) documents. The methodology further inherently provides high quality ICM document publications to use downstream in the creation of lower level hardware detail Model Based Definition (MBD) documents. The methodology can use the native CAD software capabilities of model based definitions to control the physical feature definition requirements to flow engineering requirements of an integration interface. The methodology is able to harnesses the power of relational design and has means to manage and propagate change.

Referring to the FIGS. 1-4, a flowchart is shown depicting the methodology. The methodology will be described as it relates to the integration of component parts to form an aircraft. However, this should not be seen as to limit the scope. The methodology can be applied to any structure requiring the integration of component parts during the manufacturing process.

As shown in FIGS. 1-4, the parties involved will need to determine where and how many Interface Control Models (ICMs) are required to accomplish the integration of two large scale end-item work packages. This requires the parties to identify the main or "big bone" components of the structure. For each "big bone" component, one needs to determine how other components relate to that particular "big bone" component. Thus, for example, in an aircraft, one may designate the aircraft wing assembly as one of the main (i.e. "big bone") components. One will then determine the other components to be integrated with the aircraft wing assembly and the number of ICMs required to accomplish the integration of component parts to the wing assembly. For example the wing to engine pylon, wing to main landing gear, wing to fuselage, etc.

Once it is determined where and how many Interface Control Models (ICMs) are required to accomplish the integration of two large scale end-item work packages, one will scope out the quantity of publications (i.e., parameters and geometry) and annotation information which each ICM is intended to bring into agreement. Thus, one needs to quantify and measure the manageability of the ICMs identified to be required to accomplish the integration of two large scale end-item work packages. Thus, in the wing to engine pylon, one needs to determine basic points, centerlines, planes of the wing to engine pylon attachment, etc.

In the above step, the quantity of publications and annotation information needs to be agreed upon by all parties. If not, the ICM is further broken down into two or more ICMs to make them more manageable.

If the quantity of publications and annotation information is agreed upon by all parties, ICM document(s) are created for aerospace structural type integration typical to a major fittings interface. This requires the creation of a geometrical set of objects identified here as basic starting geometry which contains geometry elements which inherently create external references and relationships to Master Datum File (MDF) Geometry aircraft definitions (i.e., "big bone" components). Some examples of the MDF geometry aircraft definitions for the wing assembly would include: wing reference plane, wing master dimension surface, engine placement, main landing gear placement, etc.

Next the structural interface detail characteristics of hardware components which make up a particular major fitting integration connection are identified. For the wing to engine pylon attachment, the hardware components may include, but are not limited to: wing lug fitting, pylon clevis fitting, attachment pin(s) (Fuse/Non Fuse), wing lug bushing, pylon clevis inner bushing, pylon clevis outer bushing, slotted washer, end cap, pawl bolt, etc.

Once the structural interface detail characteristics of hardware components which make up a particular major fitting integration connection are identified, one will identify the structural interface joint detail characteristics. The structural interface joint detail characteristics may include but are not limited to: material usage, material finish, greasing provisions, surface roughness, feature tolerance, clearances, interferences, etc.

Parametric sets are then created that are associated to the hardware components and the joint detail characteristics previously identified which make up the interface. Parametric sets are used to define and control hardware components with respect to fit, form and function. The parametric sets will detail the three parameter types; namely, prescribed, formulated and measured. The parametric sets themselves are given meaningful names associative to hardware component details, e.g. wing lug parameters, joint characteristics, pylon clevis parameters, etc.

Next, geometric sets are created. Each geometric set is associated by name to the hardware component parametric sets previously created, e.g. wing lug geometry, pylon clevis geometry, etc. The parameter sets and geometrical sets are associated to a particular hardware component and are used to define and control it with respect to fit, form and function.

Sketches are then created in the appropriate geometric set to define and visualize the hardware and detail characteristics of the interface. Parameters are created in the appropriate parametric set to parametrically drive geometry contained with the sketches.

Three dimensional (3D) surface geometries of critical interface features are then created. For example, critical interface such as bushing bearing surfaces with area out for grease grooves, breakaway knuckle-off profiles, etc. are created.

Local axes systems oriented and aligned to meaningful MDF geometry are created. The local axis systems are aligned to basic points, centerlines and planes. For example, parallel to wing reference plane along a pin centerline, normal to rear spar centerline plane along a pin centerline, etc.

Next, an assembly annotation set is inserted. Different views are created and geometry is annotated. If required, special part notes will be created. The annotation information is to be agreed upon. If not to be agreed upon and deemed as helpful information only and subject to change without notice, the annotation information should be marked reference only. One will then create captures to convey engineering intent and then publish parameters and geometry which is to be agreed upon; in addition to, the not reference only marked annotation information. Any key characteristic(s) tolerance refinement that may be required are then added. Contractual obligations are identified to ensure fit, form and function requirements are clearly defined and documented. Thus, signature agreements are obtained and the ICM document is then released to Configuration Management Authority (CMA).

Figure 5:
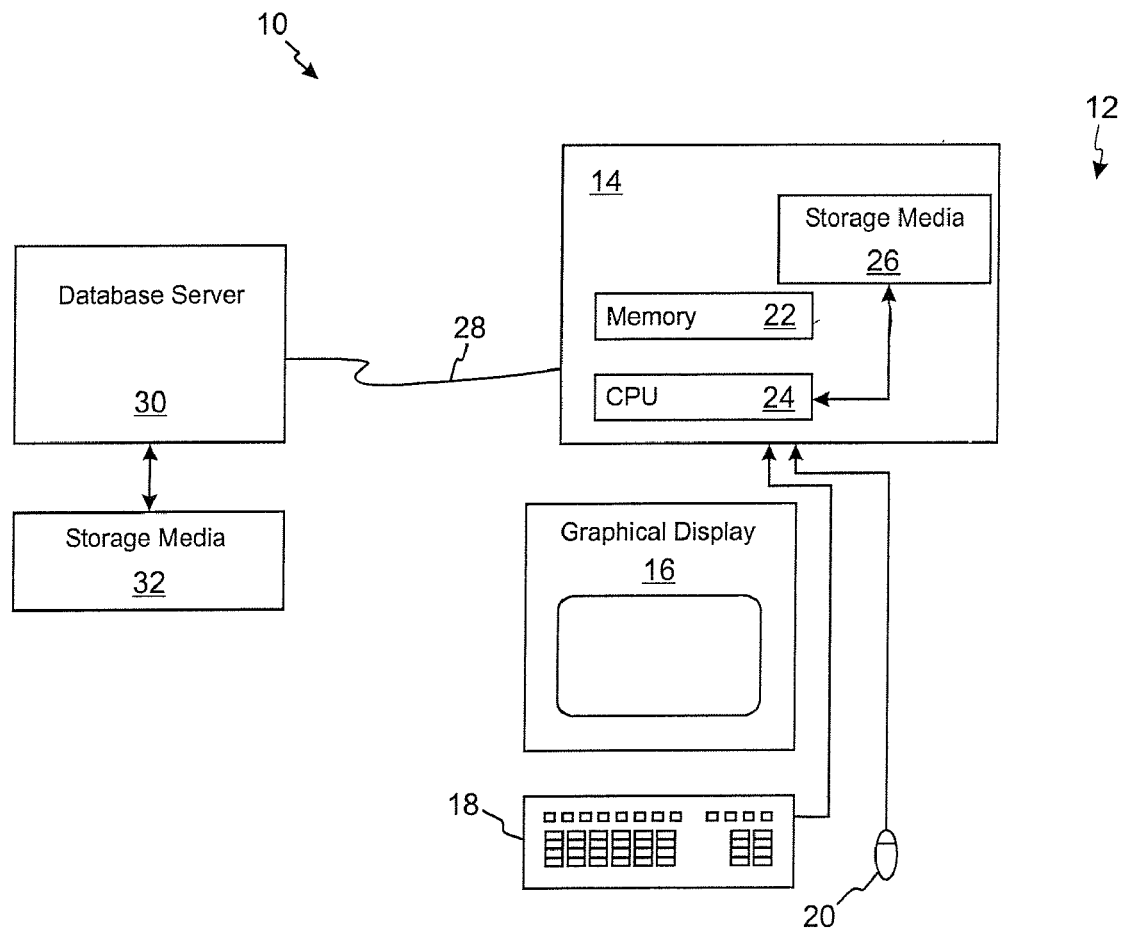
FIG. 5 is a functional block diagram of the system for controlling structural type integration to major fittings.

Referring to FIG. 5, a system 10 for controlling structural type integration to major fittings using three-dimensional Computer Aided Design (CAD) tools is shown. The system 10 uses a computer system 12. The computer system 12 will have a processor unit 14 and a graphical display 16. Input devices are coupled to the processor unit 14. The input devices may be a keyboard 18, a mouse 20 and the like. Through the execution of program instructions forming a computer program product within the computer system 12, the system 10 provides a way for controlling structural type integration to major fittings using three-dimensional Computer Aided Design (CAD) tools.

The program instructions may be located within a memory 22 of the processor unit 14 and executed by a central processing unit 24 (CPU). Any data stored from the running of the program instructions may be stored entirely within a storage media 26 and/or the memory 22. Alternatively, the computer system 12 may be coupled via a connection 28 to a network such as a local-area network (LAN), wide-area network (WAN) or the Internet. The connection 28 may be a wired connection, a wireless connection, or the like. In a network implementation, the program instructions may be located within a database server 30. Any data stored may be stored in a storage media 32 coupled to the database server 30.

Referring to FIGS. 6-11, screen shots from the system 10 are shown. The screen shots are illustrations showing examples of the 3D CAD algorithm for controlling structural type integration to major fittings. The screen shots are based upon designating the aircraft wing assembly as one of the main (i.e. "big bone") components and the integration of the engine pylon to the wing assembly. The screen shots are only examples. The system 10 can be used for any structure requiring the integration of component parts during the manufacturing process.

Figure 6:
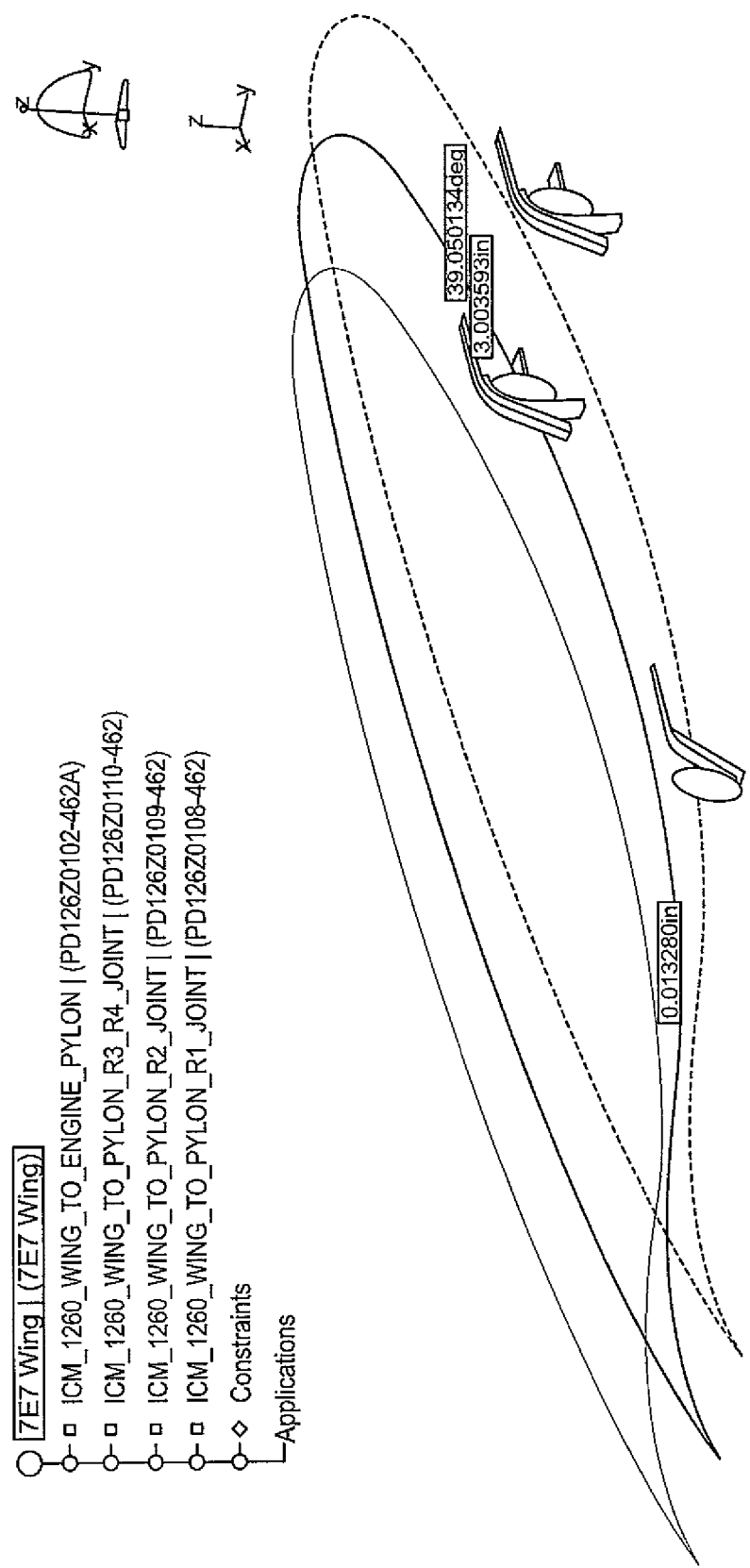
FIG. 6 is a screenshot of Interface Control Model (ICM) documents which use the software algorithm.

As shown in FIG. 6, a CAD drawing of a wing assembly 100 is shown. The wing assembly 100 has basic points, centerlines and planes for the wing to engine pylon attachment. Other ICMs define and control the details of the particular integration attachments. A tree structure menu 110 is displayed with the CAD drawing of the wing assembly 100. The tree structure menu 110 will show different component parts that will be integrated with the wing assembly 100. In the example shown in FIG. 6, the wing to engine pylon is shown. The wing to engine pylon is broken into multiple ICMS. Each ICM is related to a different part of the wing to engine pylon assembly. As shown in the tree structure menu 110, the wing to engine pylon is broken down to wing to engine pylon R1 joint, wing to engine pylon R2 joint, and wing to engine pylon R3 R4 joint.

Figure 7:
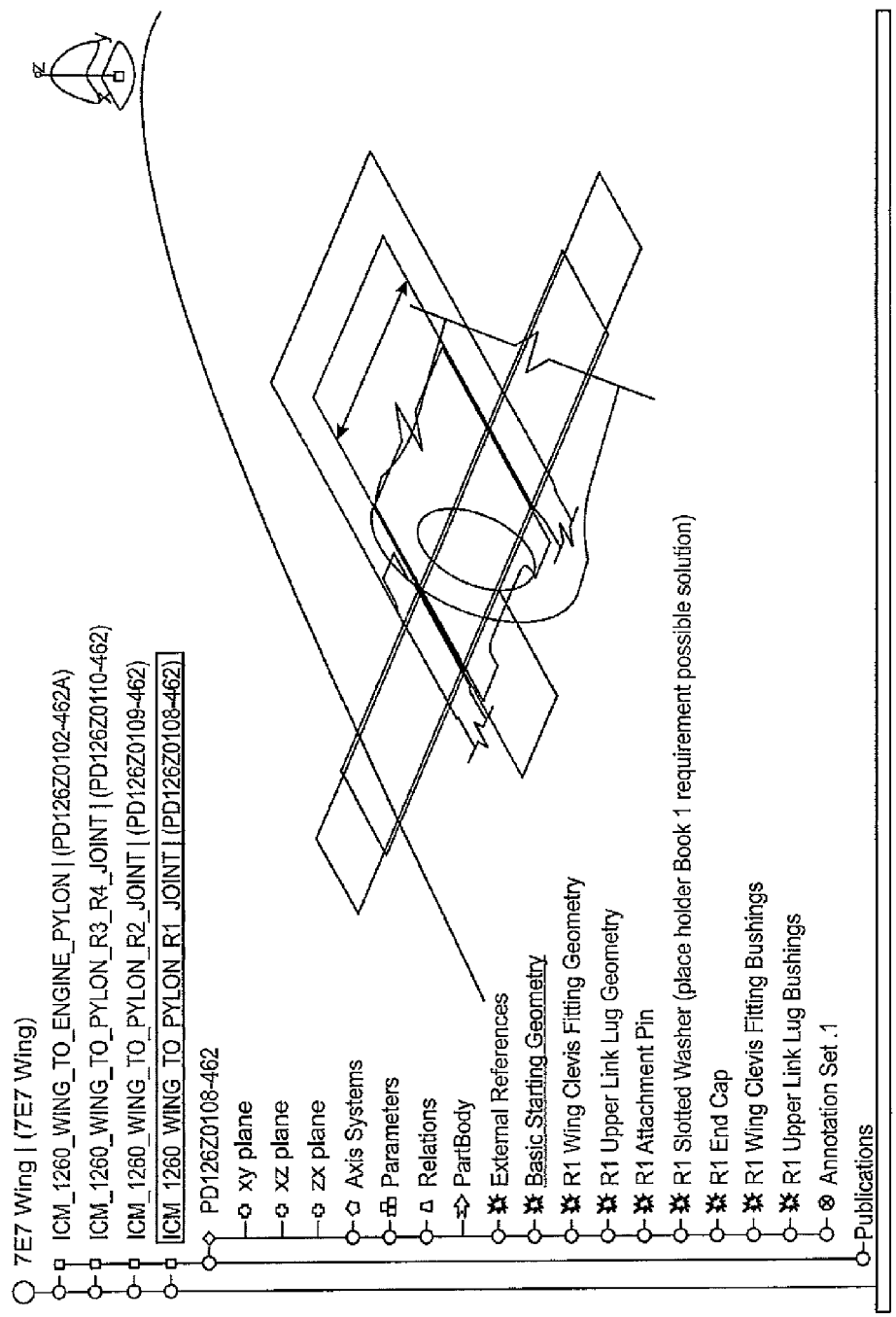
FIG. 7 is a screenshot from the software algorithm.

Referring now to FIG. 7, the ICM for the wing to engine pylon R1 joint is expanded. The algorithm methodology of parametric based, associative geometrical sets and the publication foundation organization can be seen in the expanded document tree structure menu 110. The tree structure menu 110 has been expanded to show different coordinate systems, parameter sets, hardware components, annotations, and the like for the wing to engine pylon R1 joint. Note that the geometrical sets are given meaningful names associative to detail hardware components which make up the integration connection. Physical features and geometrical tolerances are seen in the background.

Figure 8:
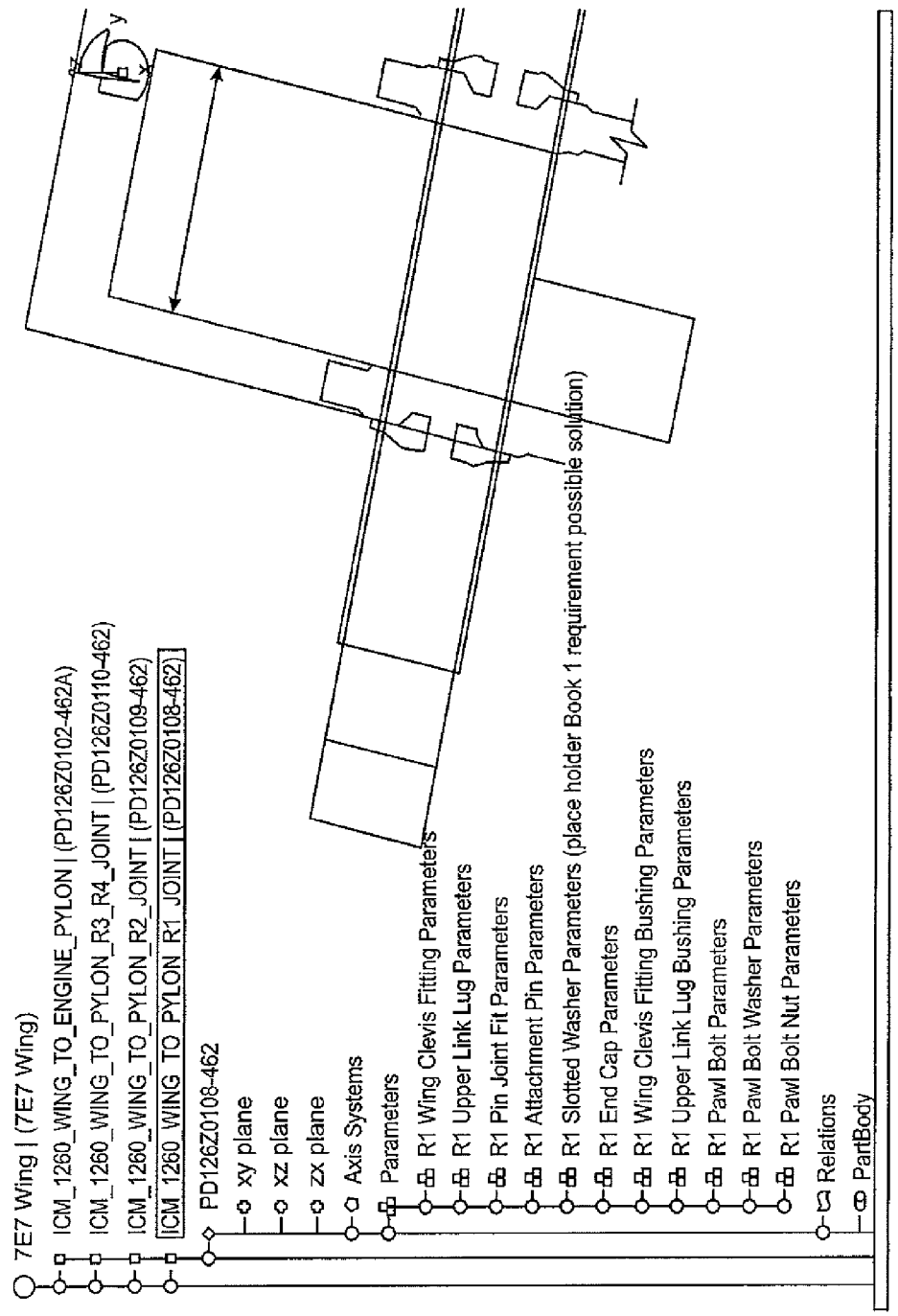
FIG. 8 is a screenshot from the software algorithm.

Referring now to FIG. 8, parametric sets are created that are associated to the hardware components and the joint detail characteristics previously identified which make up the interface. Parametric sets are used to define and control hardware components with respect to fit, form and function. The parametric sets are given meaningful names associative to hardware components which make up the integration connection. Physical features and geometrical tolerances are seen in the background.

Figure 9:
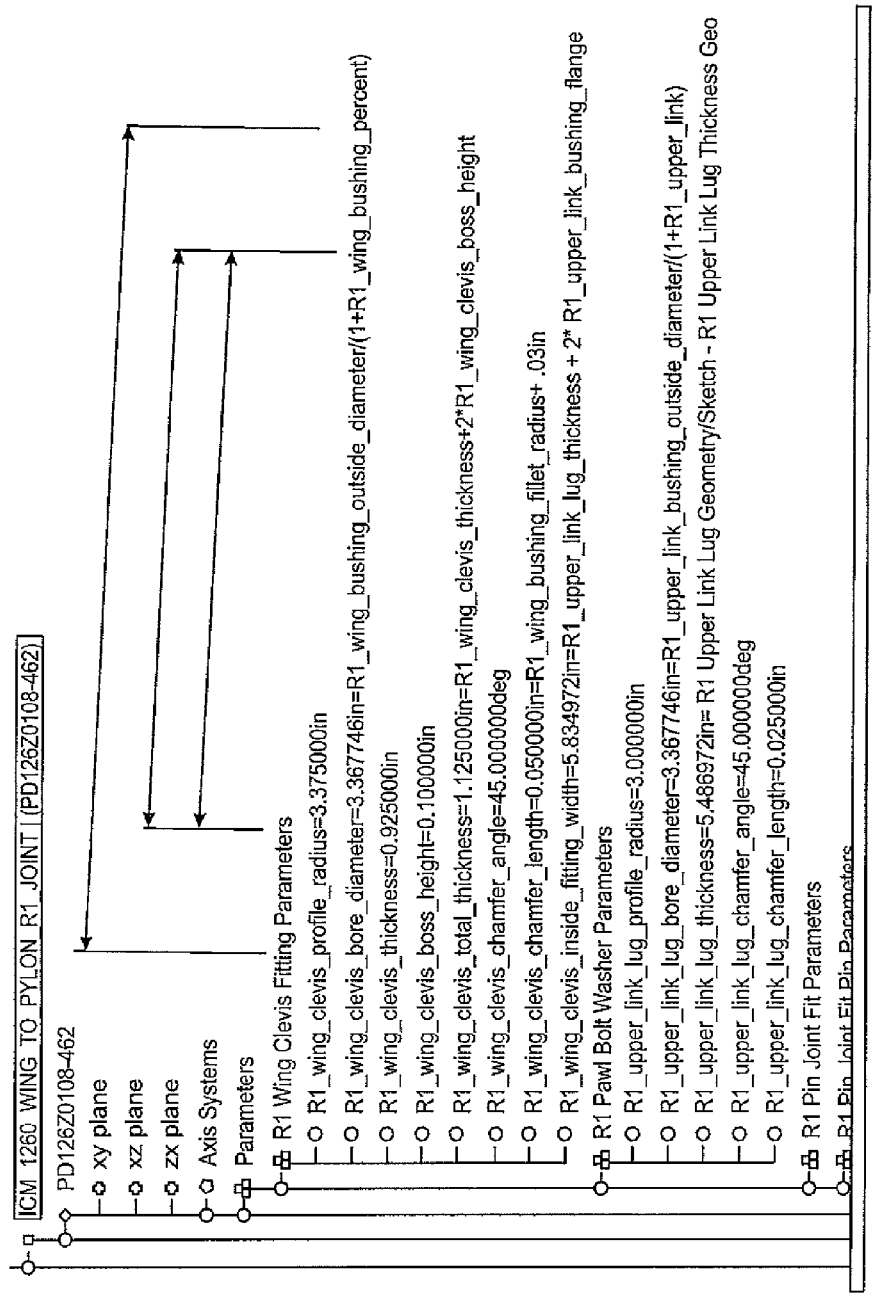
FIG. 9 is a screenshot from the software algorithm.

Each parametric set shown in FIG. 8 may be expanded. As shown in FIG. 9, the associative parametric sets R1 Wing Clevis Fitting and R1 Upper Link Lug are expanded showing the three parameter types; namely, prescribed, formulated and measured. Again, the parameters are given meaningful names associative to hardware component details, e.g. profile radius, thickness, bore diameter, etc. This is yet a further aspect of the algorithm methodology; namely, engineering knowledge formulation is unique and captured for re-use. These documents contain the details behind large magnitude load transfer joints typical to major fitting attachments required for successful fit, form and functional integration.

Figure 10:
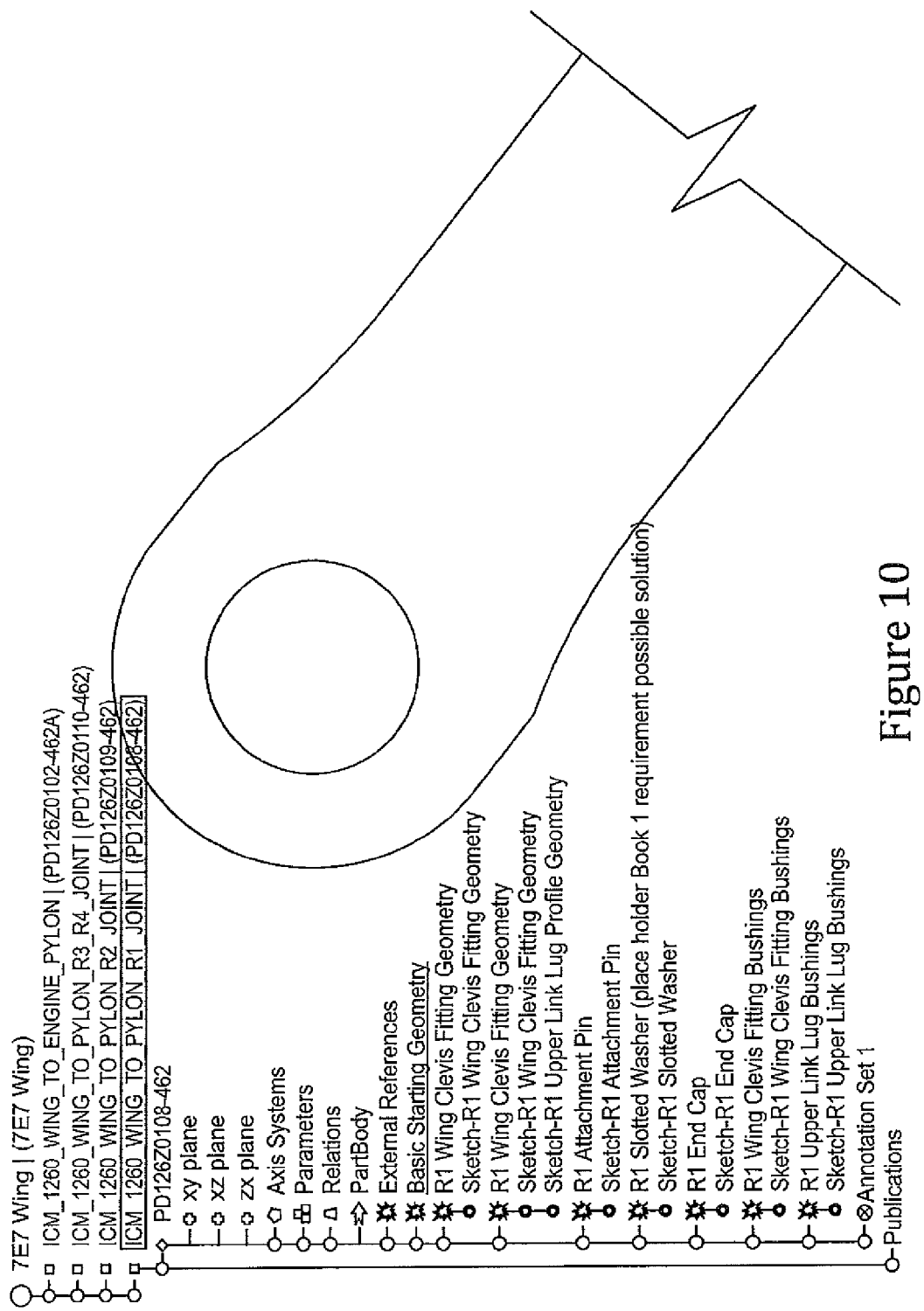
FIG. 10 is a screenshot from the software algorithm.

Once the parametric and geometric sets are created, sketches are then created in the appropriate geometric set to define and visualize the hardware and detail characteristics of the interface. Parameters are created in the appropriate parametric set to parametrically drive geometry contained with the sketches. As seen in FIG. 10, the wing to pylon R1 joint is seen with the geometric sets associative to the hardware components expanded showing the parametrically driven sketches. The sketches are given meaningful names associative to hardware component details. The information and requirements contained within the algorithm methodology is consumed partially by one company of the global collaboration and partially by another company of the global collaboration and all the information and requirements contained within the algorithm methodology is important to the main company in the role as integrator.

Figure 11:
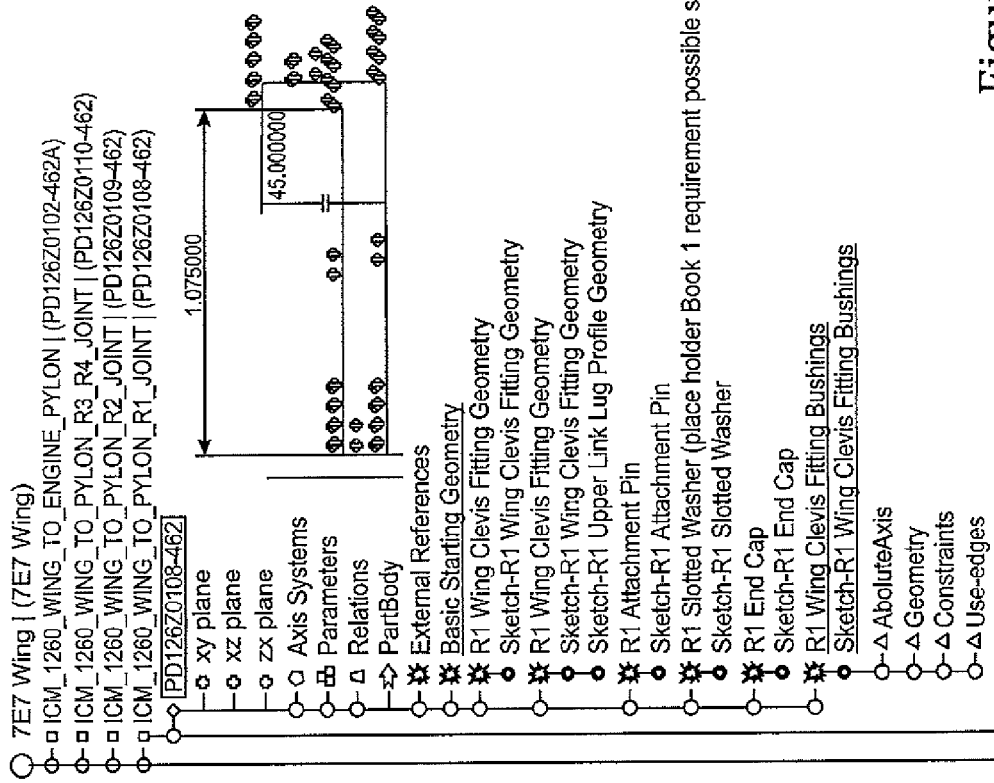
FIG. 11 is a screenshot from the software algorithm.

Referring to FIG. 11, the ICM related to the wing to pylon R1 joint is shown with the hardware component R1 Wing Clevis Fitting Bushing sketch exposed. As shown, the sketch is fully parameterized, i.e. parameter driven. Specific hardware component detail tolerance can be captured and documented in the sketch if so desired. The 3D CAD documents are based upon past experience, lessons learned, best practices and contemporary machined part fabrication capabilities.

Figure 12:
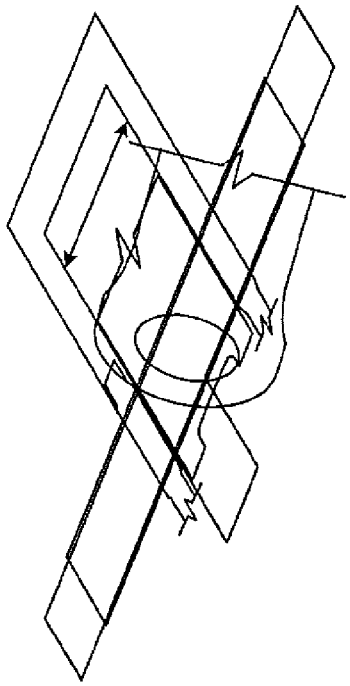
FIG. 12 is a screenshot from the software algorithm.
Figure 12:
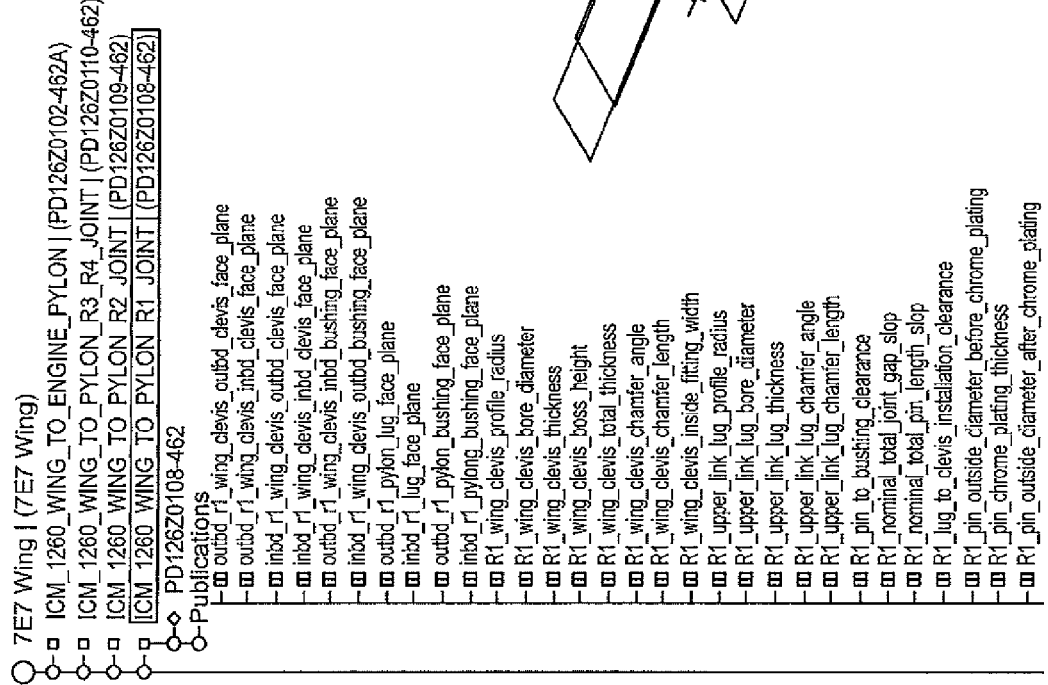

Referring to FIG. 12, the ICM related to the wing to pylon R1 joint is shown the publication branch expanded. It should be noted that only some of the key publications are shown here for brevity. Both parameters and geometrical objects are published. Note that the publications themselves match the parameter and geometry object names which were given meaningful, associative names. What is seen in 3D CAD document is seen in the background. A key aspect of the algorithm methodology is clear, easy to understand communication. This is the heart of the system 10, namely, integration of the global collaboration team by defining and publishing of the interface requirements.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A computer system comprising a processor for executing program instructions and a memory coupled to the processor for storing the program instructions, the programming instructions executing a method, the method comprising:

determining a number of main components of a structure;

determining number and content of Interface Control Models (ICM) required to accomplish integration of a first main component and a second component related to the first main component of the structure;

creating ICM document for integration of the first main component and the second component;

identifying structural interface hardware components to accomplish integration of the first main component and the second component;

creating a parametric set for each hardware component using the Interface Control Models;

creating a geometric set for each hardware component using the Interface Control Models;

creating sketches and geometry objects for each parametric set and associated geometrical set;

creating local axes systems oriented and aligned to the first main component;

creating an assembly annotation set for the first main component and the second component using the Interface Control Models; and creating a three-dimensional surface geometry of critical interface features.

2. A computer system in accordance with claim 1, the method further comprising creating a geometrical set of objects which consist of external references and relationships to the first main component.

3. A computer system in accordance with claim 1, the method further comprising:
   identifying structural interface joint detail characteristics; and
   creating parametric sets associated to the hardware components and the joint detail characteristics which make up the interface.

4. A computer system in accordance with claim 1, the method further comprising publishing parameters and geometry objects.

5. A computer system in accordance with claim 1, the method further comprising identifying contractual obligations to ensure fit, form and function requirements.

6. A computer system in accordance with claim 1, the method further comprising creating special required parts to accomplish integration of the main component and the second component.

7. A computer system comprising a processor for executing program instructions and a memory coupled to the processor for storing the program instructions, the programming instructions executing a method, the method comprising:
   determining number and content of Interface Control Models (ICM) required to accomplish integration of a main component and a second component of a structure;
   creating ICM document for integration of the main component and the second component;
   identifying structural interface hardware components to accomplish integration of the main components and the second component;
   creating a parametric set for each hardware component using the Interface Control Models;
   creating a geometric set for each hardware component using the Interface Control Models;
   creating sketches and geometry objects for each parametric set and associated geometrical set;
   creating a three-dimensional surface geometry of critical interface features; and
   publishing parameters and geometry objects for review by all companies involved in the integration.

8. A computer system in accordance with claim 7, the method further comprising creating local axes systems oriented and aligned to the main component.

9. A computer system in accordance with claim 7, the method further comprising creating an assembly annotation set for the main component and the second component using the Interface Control Models.

10. A computer system in accordance with claim 7, the method further comprising creating a geometrical set of objects which consist of external references and relationships to the main component.

11. A computer system in accordance with claim 7, the method further comprising:
    identifying structural interface joint detail characteristics; and
    creating parametric sets associated to the hardware components and the joint detail characteristics which make up the interface.

12. A computer system in accordance with claim 7, the method further comprising identifying contractual obligations to ensure fit, form and function requirements.

13. A computer system comprising a processor for executing program instructions and a memory coupled to the processor for storing the program instructions, the programming instructions executing a method, the method comprising:
    determining number and content of Interface Control Models (ICM) required to accomplish integration of a main component and a second component of a structure;
    creating ICM document for integration of the main component and the second component;
    identifying structural interface hardware components to accomplish integration of the main component and the second component;
    creating a parametric set for each hardware component using the Interface Control Models;
    creating a geometric set for each hardware component using the Interface Control Models;
    creating sketches and geometry objects for each parametric set and associated geometrical set;
    creating a three-dimensional surface geometry of critical interface features;
    creating local axes systems oriented and aligned to the main component; and
    creating an assembly annotation set for the main component and the second component using the Interface Control Models.

14. A computer system in accordance with claim 13, the method further comprising creating a geometrical set of objects which consist of external references and relationships to the main component.

15. A computer system in accordance with claim 13, the method further comprising:
    identifying structural interface joint detail characteristics; and
    creating parametric sets associated to the hardware components and the joint detail characteristics which make up the interface.

16. A computer system in accordance with claim 13, the method further comprising publishing parameters and geometry objects.

17. A computer system in accordance with claim 13, the method further comprising identifying contractual obligations to ensure fit, form and function requirements.

18. A computer system in accordance with claim 13, the method further comprising creating special required parts to accomplish integration of the main component and the second component.

* * * * *